United States Patent [19]

Leslie

[11] Patent Number: 4,575,644
[45] Date of Patent: Mar. 11, 1986

[54] CIRCUIT FOR PREVENTION OF THE METASTABLE STATE IN FLIP-FLOPS

[75] Inventor: Duane W. Leslie, Pasadena, Calif.

[73] Assignee: Burroughs Corporation, Detroit, Mich.

[21] Appl. No.: 557,690

[22] Filed: Dec. 2, 1983

[51] Int. Cl.$^4$ .......................... H03K 3/29; H03K 5/13
[52] U.S. Cl. .................................... 307/291; 307/443; 307/269; 307/272 R; 307/480; 328/164; 328/206
[58] Field of Search ............... 307/528, 442, 291, 443, 307/269, 480, 272 A, 481, 272 R, 453; 328/164, 201, 63, 206, 34; 371/61, 47; 375/106, 108

[56] References Cited

U.S. PATENT DOCUMENTS

| | | | |
|---|---|---|---|
| 3,921,011 | 11/1975 | Orgill | 307/251 |
| 4,048,521 | 9/1977 | Thompson et al. | 307/291 |
| 4,093,878 | 6/1978 | Paschal et al. | 307/291 |

OTHER PUBLICATIONS

"Theoretical and Experimental Behavior of Synchronizers Operating in the Metastable Region", IEEE Transactions on Computers, vol. C-24, No. 6, Jun. 1975, pp. 604–615, by G. R. Louranz.

"Anomalous Behavior of Synchronizer and Arbiter Circuits", IEEE Transactions on Computers, Apr. 1973, pp. 421–422, by T. J. Chaney et al.

Primary Examiner—Stanley D. Miller
Assistant Examiner—Richard Roseen
Attorney, Agent, or Firm—Nathan Cass; Kevin R. Peterson; Edmund M. Chung

[57] ABSTRACT

A synchronizing circuit using a switchable bistable element for synchronizing an asymmetric signal with the clock of a data processing system. The occurrence of a balanced or metastable state in the switchable bistable synchronizing element which can slow up the data transfer rate is inhibited by applying an asymmetric injection signal thereto having a frequency, magnitude and asymmetry such that the maintenance of a balanced or metastable state in the synchronizing element is inhibited without interfering with the normal switching operation thereof.

13 Claims, 4 Drawing Figures

CIRCUIT FOR PREVENTION OF THE METASTABLE STATE IN FLIP-FLOPS

BACKGROUND OF THE INVENTION

This invention relates generally to improved apparatus and methods for synchronizing signals in a data processing system.

In a data processing system, timing is typically provided by one or more system clocks which are used for clocking signals into the various logic and storage elements of the system, such as flip-flops and latches. When an input signal applied to a system element is properly synchronized with an input clock pulse, reliable operation can readily be provided, since the resulting clocked signals applied to the element will have a predictable duration and energy level.

In modern day computer systems, provision must be made for properly handling asynchronous signals as well as synchronous signals, since most clocked central processors are required to interact with other systems, subsystems or peripherals having independent clocking. The central processor typically uses a clock pulse to interrogate the input line on which an asynchronous signal is applied. Since the clock pulse and the asynchronous signal have no defined relationship, the resulting effect may be a misshapen pulse (commonly referred to as a split pulse or runt pulse) which can produce unreliable results.

A well known solution to the above problem is to apply the clock pulse and the asynchronous signal to a synchronizing element, such as a flip-flop or latch. The assumption is then made that, even if the clock pulse and asynchronous signal have little overlap, the flip-flop or latch will nevertheless arrive at a stable state within some known minimum time after the clock pulse is applied, at which time the output of the synchronizing element may then be used as a properly synchronized logical pulse.

The assumption that the synchronizer element will always provide a stable output after some known minimum period of time has been found to be unreliable because, for certain pulse energy levels, a metastable state is produced which remains for an indeterminate period of time. As a result, it has been found necessary in the design of computer systems to allow a significantly greater waiting time before using the output of the synchronizing element in order to obtain an acceptable error rate. This problem has been considered, for example, in the following articles: T. J. Chaney, et al., "Anomalous Behaviour of Synchronizer and Arbiter Circuits", IEEE Transactions on Computers, April 1973, pp. 421-2; and G. R. Couranz, et al., "Theoretical and Experimental Behaviour of Synchronizers Operating in the Metastable Region", IEEE Transactions on Computers, Vol. C-24, No. 6, June 1975. Both of these articles suggest that the problem be solved by appropriately increasing the wait time before using the output of the synchronizing flip-flop.

SUMMARY OF THE INVENTION

The above solution to the synchronizer instability problem whereby the synchronizer waiting time is increased to obtain an acceptable error level has the disadvantage of limiting the transfer data rate that can be provided. Another difficulty is that considerable effort must sometimes be expended in order to determine what waiting time will provide an acceptable error rate in a given system.

In accordance with the present invention, I have discovered that by injecting a relatively small amount of energy into the synchronizing element in an asymmetric fashion and at a slower rate than the element's reaction time, the occurrence of a balanced or metastable condition can be inhibited. As a result, there is no need to provide the additional waiting time normally required to overcome the above described synchronizer instability problem, thereby permitting greater data transfer rates to be obtained.

Accordingly, it is a broad object of the present invention to provide improved apparatus and methods for synchronizing asynchronous signals in a data processing system.

Another object of the invention is to provide apparatus and methods for increasing the data transfer rate between independently clocked systems.

A more specific object of the invention is to provide apparatus and methods for inhibiting the occurrence of a balanced or metastable condition in a synchronizing element so as to obviate the need for providing an additional waiting time before the output of the synchronizing element can be used.

An additional object of the invention is to provide for accomplishing the above objects in a relatively simple and inexpensive manner.

The specific nature of the invention as well as other objects, features, advantages and uses thereof will become evident from the following description of a preferred embodiment along with the accompanying drawings.

DESCRIPTION OF THE PRIOR ART

Figure 1:
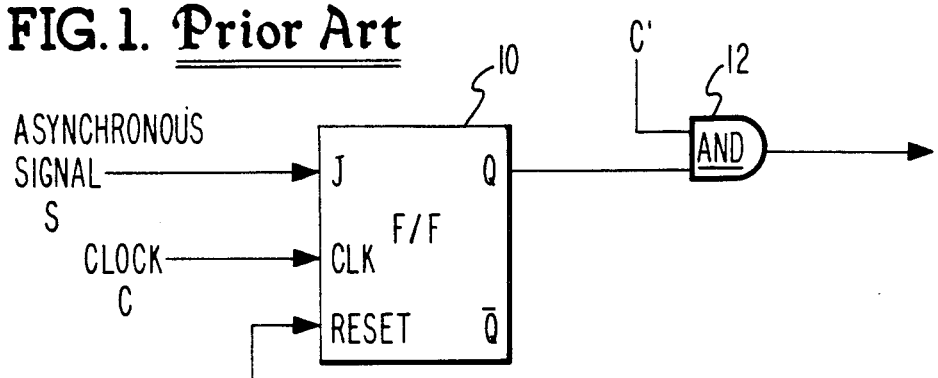
FIG. 1 is a schematic electrical circuit diagram of a prior art synchronizing circuit.

FIG. 1 illustrates how synchronization is conventionally provided using a flip-flop 10. As shown, an asynchronous signal S is applied to an input J of flip-flop 10 and a clock pulse C is applied to a clock input CK of flip-flop 10, the output of flip-flop 10 being obtained at an output Q which is applied to an AND gate 12 along with a delayed clock C'.

Figure 2:
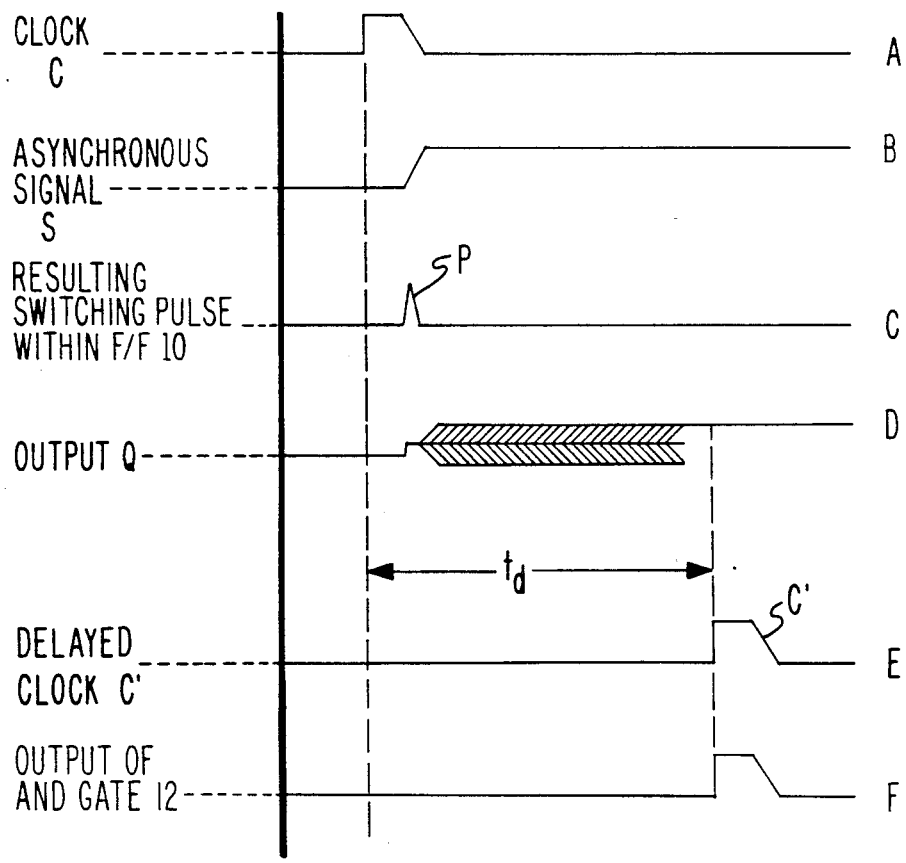
FIG. 2 is a series of timing graphs for use in describing the operation of the circuit of FIG. 1.

The timing graph of FIG. 2 illustrates how the prior art circuit of FIG. 1 handles the synchronizer instability problem occurring when the input clock C (graph A) and the asynchronous input signal S (graph B) occur at times such that only a runt pulse P (graph C) is produced within flip-flop 10 for switching purposes. This runt pulse P causes a metastable state to be maintained which produces an indeterminate value on output Q as illustrated in graph D in FIG. 2. If specific circuit parameters are known (which is not always the case), it is possible to calculate the probability of these metastable states, and thus obtain a prediction as to how much waiting time should be provided before using the signal appearing at the output Q of the flip-flop 10 in order to obtain a required error rate. Accordingly, as illustrated in graph E in FIG. 2, the delay $t_d$ provided for the delayed clock pulse C' applied to AND gate 12 is chosen to be such that the probability of obtaining a valid signal at the flip-flop output Q will be sufficiently high to provide the required error rate. Graph F illustrates the resulting output from AND gate 12.

DESCRIPTION OF THE PREFERRED EMBODIMENT

Figure 3:
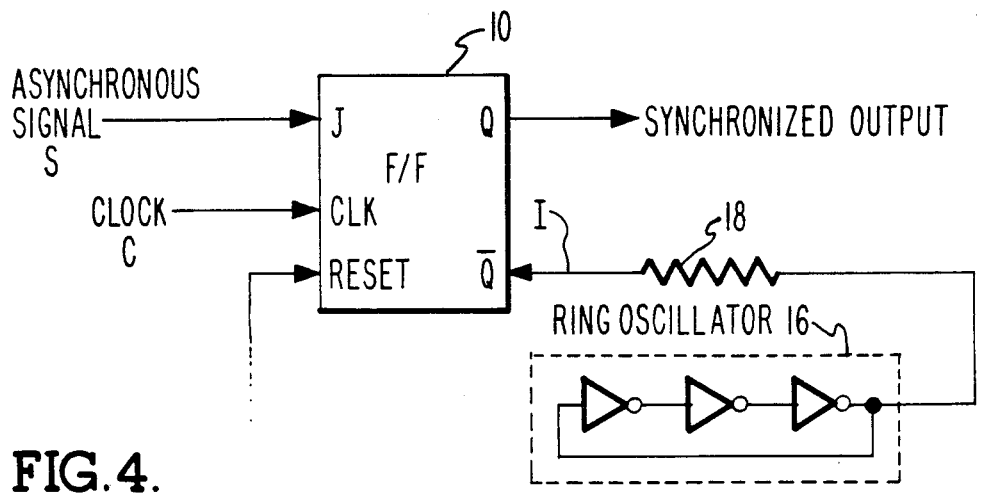
FIG. 3 is a schematic electrical circuit diagram of a preferred embodiment of a synchronizing circuit in accordance with the invention.

Referring next to FIG. 3, a preferred embodiment of the present invention is illustrated which provides for proper synchronization of an asynchronous signal while substantially eliminating any need for an additional waiting period as is required for the prior art circuit of FIG. 1. Basically, this most important feature is achieved by injecting a relatively small amount of energy into a synchronizing element in an asymmetric fashion and at a slower rate than the element's reaction time. The manner in which this is accomplished in the preferred embodiment illustrated in FIG. 3 will now be described.

The synchronizing element in the preferred embodiment of FIG. 3 is illustrated as being the same conventional flip-flop 10 as is shown in FIG. 1. A suitable flip-flop which may, for example, be used is one of the two flip-flops provided on a standard 74S109 integrated circuit chip containing two J-K flip-flops, each having a 5-7 nanosecond reaction time (about 140 to 200 megahertz). An appropriate injection signal for the preferred embodiment of FIG. 3 is provided by a ring oscillator 16 which may, for example, be a 50 megahertz ring oscillator such as is contained on a standard 74S04 integrated circuit chip. Preferably, the ring oscillator 16 has a frequency no greater than approximately one-half of the reaction time of the flip-flop 10. The ring oscillator 16 provides a distorted sine wave output which is injected into the inverse $\overline{Q}$ output of the flip-flop 10 through a resistor 18. The resistor 18 is chosen so that the magnitude of the ring oscillator signal which is applied to the $\overline{Q}$ flip-flop output does not affect the normal switching operation of the flip-flop 10. For example, where the logical levels are 3 volts and 0.3 volts and a 74S109 flip-flop and a 74S04 ring oscillator are used, a suitable value for the resistor 18 is 1780 ohms. This results in a 200 millivolt, 50 megahertz distorted sine wave signal I being applied to the $\overline{Q}$ flip-flop output. It has been found that this signal applied to $\overline{Q}$ does not interfere with normal flip-flop operation, yet inhibits the maintenance of a balanced or metastable state of the flip-flop 10. Consequently a valid signal will be obtainable at the Q output of flip-flop 10 in the synchronizing circuit of FIG. 3 after the normal flip-flop settling time without having to provide an additional waiting time, as is required in the prior art synchronizing circuit illustrated in FIG. 1. Furthermore, since the preferred embodiment of the synchronizing circuit illustrated in FIG. 3 does not permit a balanced or metastable state to be maintained, the error rate of the system will not be dependent upon the design of the synchronizing circuit. As pointed out previously, the prior art synchronizing circuit illustrated in FIG. 1 requires that the waiting period be chosen based on probability considerations to provide a desired error rate in order to take into account the fact that the metastable state may remain for an indefinite period of time.

Figure 4:
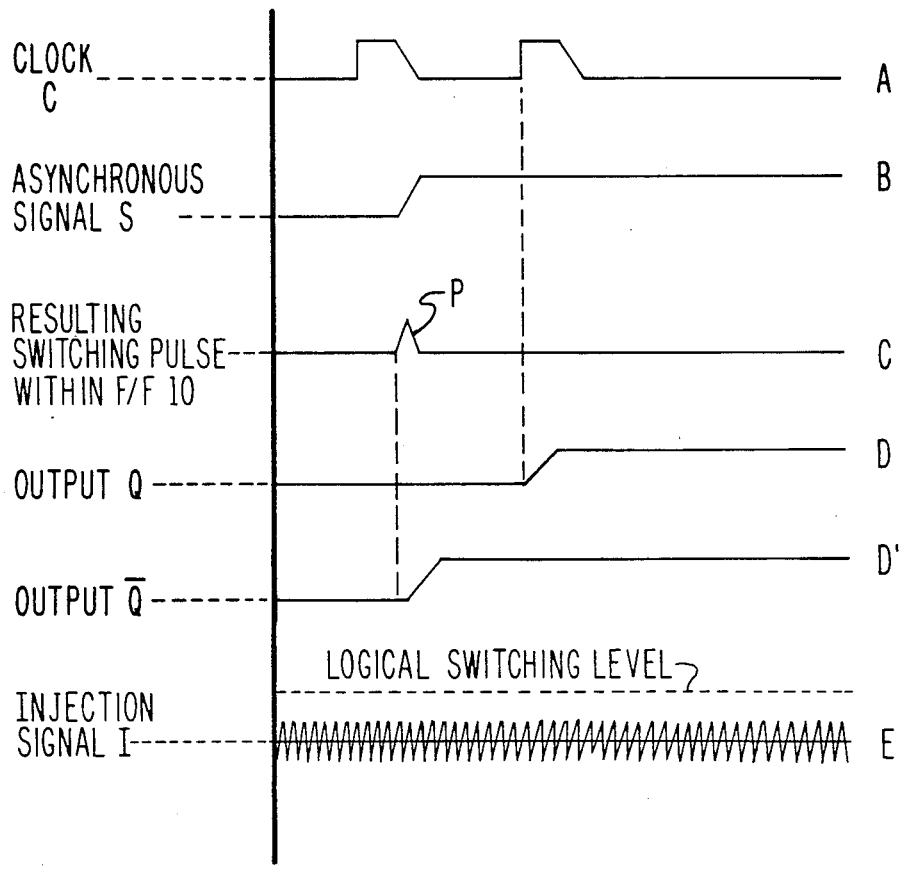
FIG. 4 is a series of timing graphs for use in describing the operation of the circuit of FIG. 3.

The timing graphs of FIG. 4 illustrate typical operation of the preferred synchronizing circuit illustrated in FIG. 3. As in FIG. 2, graph A illustrates the clock C and graph B illustrates an input asynchronous signal S which occurs at a time such that a split or runt pulse P (graph C) is produced within flip-flop 10 for switching purposes (FIGS. 1 and 3). It will be remembered that, in the prior art synchronizing circuit illustrated in FIG. 1, such a runt pulse P as illustrated in graph C can cause a metastable state to be maintained by the flip-flop 10 for an indefinite period of time (see graph D of FIG. 2).

In the preferred synchronizing circuit of the invention illustrated in FIG. 3, on the other hand, the injected signal I applied to the $\overline{Q}$ flip-flop output will not permit a balanced or metastable state to be maintained. A typical injection signal I is shown in graph E in FIG. 4. Thus, as illustrated in graph D of FIG. 4, if the runt pulse P in graph C is insufficient to cause the flip-flop 10 to switch, the output Q will remain in its "0" or "false" state until the next occurring clock, at which time the flip-flop 10 will then switch to produce a "1" or "true" signal at the Q output. However, if the runt pulse P in graph C of FIG. 3 is sufficient to cause switching of the flip-flop 10, the flip-flop output Q will then switch to a "1" or "true" state in substantially the normal settling time expected for the flip-flop 10, as illustrated in graph D' in FIG. 3. At worst, only a relatively brief period of metastability will occur depending upon the characteristics of the particular injected signal I applied to the $\overline{Q}$ flip-flop input.

It will be understood that the resulting synchronized "1" or "true" signal appearing at the Q flip-flop output (as illustrated in graphs D and D' in FIG. 4) in response to the detection of the asynchronous input signal S may be employed in a conventional manner as a synchronized signal for use by a data processing system which supplied the clock C. It will also be understood that this synchronized signal at the flip-flop output Q is also employed in a conventional manner (not shown) to prevent interrogation of the asynchronous input line until the system is ready to receive a new asynchronous signal and also to cause a reset signal to be applied to the flip-flop 10 preparatory to synchronizing the next occurring asynchronous signal.

Although the above description has been primarily concerned with a particular preferred embodiment of the invention, it is to be understood that many modifications and variations in construction and use are possible which are within the inventive contribution disclosed herein.

For example, although the injected signal I in FIG. 3 is illustrated as being applied to the $\overline{Q}$ input of the flip-flop 10, it may also be applied to other inputs of the flip-flop 10. Also, other types of synchronizing elements may also be employed. The important requirement is that the asymmetry, frequency and magnitude of the injected signal be such that the maintenance of a balanced or metastable state of the synchronizing element is prevented (or reduced to an acceptable time period) without interfering with the normal operation of the synchronizing element.

The present invention should thus be considered as encompassing all possible modifications and variations coming within the scope of the invention as defined by the appended claims.

What is claimed is:

1. A synchronizing circuit comprising:
means providing an asynchronous input signal;
means providing a clock signal;
a switchable bistable element;

said switchable bistable element being responsive to logical combination of said asynchronous input signal and said clock signal for providing a synchronized output signal corresponding to reception of said asynchronous input signal; and signal injection means for injecting an injection signal into said switchable bistable element in an asymmetric fashion and at a sufficiently slower rate than the reaction time of said switchable bistable element so as to inhibit maintenance of a balanced or metastable state of said switchable bistable element without interfering with normal switching operation of said switchable bistable element.

2. The invention in accordance with claim 1, wherein said injection signal has a frequency no greater than approximately one-half of the frequency corresponding to the reaction time of said switchable bistable element.

3. The invention in accordance with claim 1, wherein said switchable bistable element is a flip-flop.

4. The invention in accordance with claim 3, wherein said signal injecting means is an oscillator providing an asymmetric output signal.

5. The invention in accordance with claim 3, wherein said flip-flop has input and output terminals comprising at least a signal input, a clock input and an output, wherein said asynchronous input signal is applied to said signal input, wherein said clock signal is applied to said clock input, and wherein said synchronized output signal is produced on said output.

6. The invention in accordance with claim 5, including another terminal in addition to said signal input, said clock input and said output, and wherein said injection signal is applied to said another terminal.

7. The invention in accordance with claim 6, wherein said another terminal is an output which provides an output signal which is inverse to the signal provided at the first-mentioned output.

8. The invention in accordance with claim 6, wherein said signal injection means includes an impedance via which said injection signal is applied to said another terminal, said impedance being chosen so that the magnitude of said injection signal does not affect the normal switching operation of said flip-flop.

9. The invention in accordance with claim 6, wherein said terminals also include a reset input for resetting said flip-flop preparatory to synchronizing a later occurring asynchronous input signal.

10. The invention in accordance with claim 5, wherein said signal injection means is a ring oscillator.

11. A method for inhibiting maintenance of a balanced or metastable state in a switchable bistable synchronizing element to which a clocked asynchronous signal is applied, said method comprising injecting an injection signal into said switchable bistable element in an asymmetric fashion and at a sufficiently slower rate than the reaction time of said element such that maintenance of a balanced or metastable state of said bistable synchronizing element is inhibited without interfering with normal switching operation of said bistable switching element.

12. The invention in accordance with claim 11, wherein said injection signal has a frequency no greater than approximately one-half of the frequency corresponding to the reaction time of said bistable synchronizing element.

13. The invention in accordance with claim 11, wherein said switchable bistable synchronizing element is a flip-flop having input and output terminals, and wherein said injection signal is applied to one of said terminals.

* * * * *